(12) United States Patent
Oda et al.

(10) Patent No.: US 8,330,276 B2
(45) Date of Patent: Dec. 11, 2012

(54) SEMICONDUCTOR DEVICE AND METHOD FOR MANUFACTURING THE SAME

(75) Inventors: Noriaki Oda, Ibaraki (JP); Shinichi Chikaki, Ibaraki (JP)

(73) Assignee: Renesas Electronics Corporation, Kanagawa (JP)

( * ) Notice: Subject to any disclaimer, the term of this patent is extended or adjusted under 35 U.S.C. 154(b) by 180 days.

(21) Appl. No.: 12/837,069

(22) Filed: Jul. 15, 2010

(65) Prior Publication Data

US 2011/0049719 A1    Mar. 3, 2011

(30) Foreign Application Priority Data

Aug. 25, 2009    (JP) ................................ 2009-194145

(51) Int. Cl.
*H01L 23/52*    (2006.01)
*H01L 21/4763*    (2006.01)

(52) U.S. Cl. ............... 257/758; 257/762; 257/E21.575; 257/E23.161; 438/622; 438/687

(58) Field of Classification Search .......... 257/758–760, 257/762, E21.575, E23.161; 438/622–624, 438/687
See application file for complete search history.

(56) References Cited

U.S. PATENT DOCUMENTS

| | | | |
|---|---|---|---|
| 6,583,048 B1 * | 6/2003 | Vincent et al. | 438/623 |
| 2006/0220253 A1 * | 10/2006 | Hamada et al. | 257/758 |
| 2007/0082476 A1 * | 4/2007 | Kawahara et al. | 438/618 |

FOREIGN PATENT DOCUMENTS

| | | |
|---|---|---|
| JP | 2006-190872 (A) | 7/2006 |
| JP | 2006-319116 | * 11/2006 |
| JP | 2006-319116 (A) | 11/2006 |
| JP | 2007-214403 (A) | 8/2007 |

OTHER PUBLICATIONS

C.-H. Jan et al., 90 nm Generation, 300mm Wafer Low k ILD/CU Interconnect Technology, Proceedings of the 2003 International Interconnect Technology Conference, Jun. 2003, pp. 15-17.
N. Ohashi et al. Analytical Study of Leakage Characteristics Change During Multilevel Interconnet Process Using Porogen-type Porous SiOC (k=2.4)/Cu System, Proceedings of the 11$^{th}$ Annual 2008 International Interconnect Technology Conference, Jun. 2008, pp. 58-60.
N. Oda et al, Comprehensive Study of 32 nm Node Ultralow-k/Cu ($k_{eff}$ =2.6) Dual Damascene Integration Featuriing Short TAT Silylated Porous Silica (k=2.1), IEEE International Electron Devices Meeting, Dec. 2008, pp. 26.6.1-26.6.4.

* cited by examiner

*Primary Examiner* — Tuan N. Quach
(74) *Attorney, Agent, or Firm* — Foley & Lardner LLP (57) ABSTRACT

The semiconductor device includes a first interconnect layer insulating film, first copper interconnects that are embedded in the first interconnect layer insulating film, and an interlayer insulating film that is formed on the first copper interconnects and the first interconnect layer insulating film. The semiconductor device includes a second interconnect layer insulating film that is formed on the interlayer insulating film and second copper interconnects that are embedded in the second interconnect layer insulating film. The first and second interconnect layer insulating films include first and second low dielectric constant films, respectively. The interlayer insulating film has higher mechanical strength than the first and second interconnect layer insulating films.

12 Claims, 5 Drawing Sheets

|   | INTERCONNECT LAYER INSULATING FILM | INTERLAYER INSULATING FILM (INTER-VIA-LAYER INSULATING FILM) |
|---|---|---|
| 1 | POROUS SiO | POROUS SiOC |
| 2 | POROUS SiO | DENSE SiOC |
| 3 | POROUS SiO | DENSE SiO$_2$ |
| 4 | POROUS SiO | POROUS SiO |
| 5 | POROUS SiOC | DENSE SiOC |
| 6 | POROUS SiOC | DENSE SiO$_2$ |
| 7 | POROUS SiOC | POROUS SiOC |
| 8 | POROUS SiOC | POROUS SiO |
| 9 | LADDER OXIDE | DENSE SiO$_2$ |
| 10 | HSQ | DENSE SiO$_2$ |

SEMICONDUCTOR DEVICE AND METHOD FOR MANUFACTURING THE SAME

This application is based on Japanese patent application No. 2009-194145 the content of which is incorporated hereinto by reference.

BACKGROUND

1. Technical Field

The present invention relates to a semiconductor device and a method for manufacturing the semiconductor device.

2. Related Art

In a semiconductor device that has a multilayer interconnect structure including copper interconnects and low dielectric interconnect layer insulating films, films of the same material are normally used for the interconnect layer insulating films and an interlayer insulating film. An example of such a semiconductor device is disclosed in "Proceedings of the 2008 IITC (International Interconnect Technology Conference), Jun. 2-4, 2008, 2.5, p.p. 15-17".

According to Japanese Laid-Open Patent Publication No. 2007-214403, a diffusion preventing film with compressive stress is formed to cover embedded interconnects after the formation of those interconnects, and a heat treatment involving ultraviolet irradiation is then performed. In this manner, the hardness and elastic modulus of the interconnect layer insulating films are increased.

According to Japanese Laid-Open Patent Publication No. 2006-319116, after embedded interconnects are formed, ultraviolet irradiation is performed on the interconnect layer insulating films to lower the density in the upper portions of the interconnect layer insulating films and reduce the capacitance between the interconnects. By the technique disclosed in Japanese Laid-Open Patent Publication No. 2006-319116, each interconnect layer insulating film is not modified from the surface to the bottom face, but only the upper portion of an interlayer insulating film is modified.

According to Japanese Laid-Open Patent Publication No. 2006-190872, ultraviolet irradiation is performed to increase the density in the surface portion of each porous interconnect layer insulating film. By the technique disclosed in Japanese Laid-Open Patent Publication No. 2006-190872, each interconnect layer insulating film is not modified from the surface to the bottom face, but only the surface portion of each interconnect layer insulating film is modified.

SUMMARY

The present inventors has recognized as follows. Where each interconnect layer insulating film and an interlayer insulating film are made of the same material, however, the film strength of the interlayer insulating film become insufficient. As a result, cracks might be formed in the interlayer insulating film, or the interlayer insulating film might be delaminated.

In one embodiment, there is provided a semiconductor device including a first interconnect layer insulating film, a plurality of first copper interconnects that are embedded in the first interconnect layer insulating film, an interlayer insulating film that is formed on the first copper interconnects and the first interconnect layer insulating film, a second interconnect layer insulating film that is formed on the interlayer insulating film, and a plurality of second copper interconnects that are embedded in the second interconnect layer insulating film, wherein the first interconnect layer insulating film including a first low dielectric constant film that is made of an insulating film material having a relative permittivity lower than 3.0, wherein the second interconnect layer insulating film including a second low dielectric constant film that is made of an insulating film material having a relative permittivity lower than 3.0, and wherein the interlayer insulating film having higher mechanical strength than the first and second interconnect layer insulating films.

According to the present invention, the interlayer insulating film has higher mechanical strength than the low dielectric constant films of the interconnect layer insulating films, and sufficient film strength can be secured for the interlayer insulating film. Accordingly, the present invention can provide a semiconductor device in which formation of cracks in the interlayer insulating film and delamination of the interlayer insulating film can be appropriately restrained.

In another embodiment, there is provided a method for manufacturing a semiconductor device, including forming a first interconnect layer insulating film, forming a plurality of first copper interconnects that are embedded in the first interconnect layer insulating film, forming an interlayer insulating film on the first copper interconnects and the first interconnect layer insulating film, forming a second interconnect layer insulating film on the interlayer insulating film, and forming a plurality of second copper interconnects that are embedded in the second interconnect layer insulating film, the forming the first interconnect layer insulating film, the forming the first copper interconnects, the forming the interlayer insulating film, wherein the forming the second interconnect layer insulating film, and the forming the second copper interconnects being performed in this order, wherein the first interconnect layer insulating film including a first low dielectric constant film that is made of an insulating film material having a relative permittivity lower than 3.0, wherein the second interconnect layer insulating film including a second low dielectric constant film that is made of an insulating film material having a relative permittivity lower than 3.0, and wherein the forming the interlayer insulating film including forming the interlayer insulating film having higher mechanical strength than the first and second low dielectric constant films.

According to the present invention, the strength of the interlayer insulating film can be sufficiently secured.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that any similar constituents will be given the same reference numerals or symbols in all drawings, and explanations therefor will not be repeated.

[First Embodiment]

Figure 1:
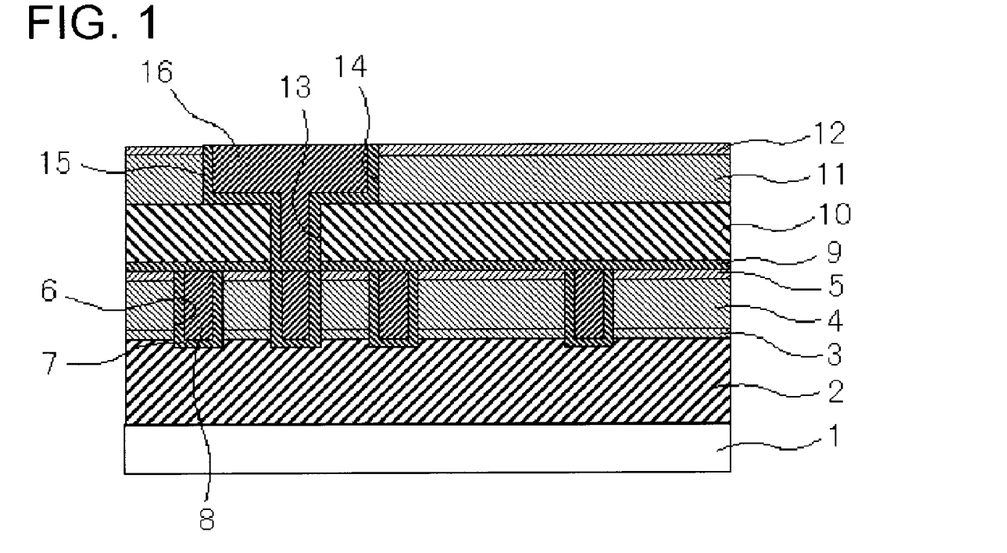
FIG. 1 shows a cross-sectional view illustrating the structure of a semiconductor device according to a first embodiment.
Figure 4:
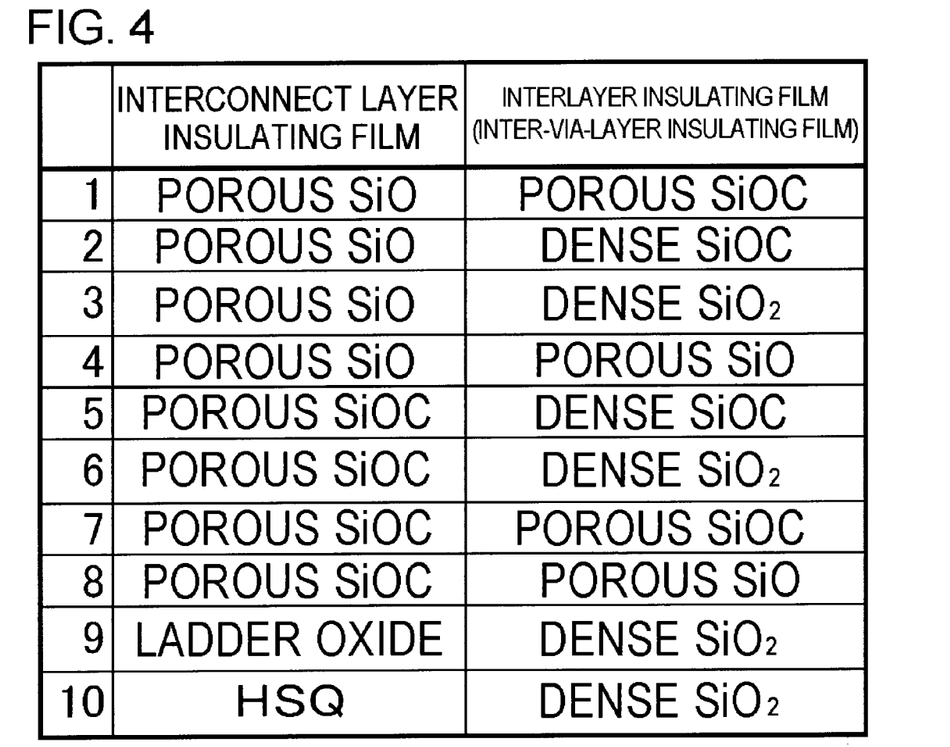
FIG. 4 shows examples of preferred combinations of the material forming the interconnect layer insulating films and the material forming the interlayer insulating film (the inter-via-layer insulating film)
Figure 5:
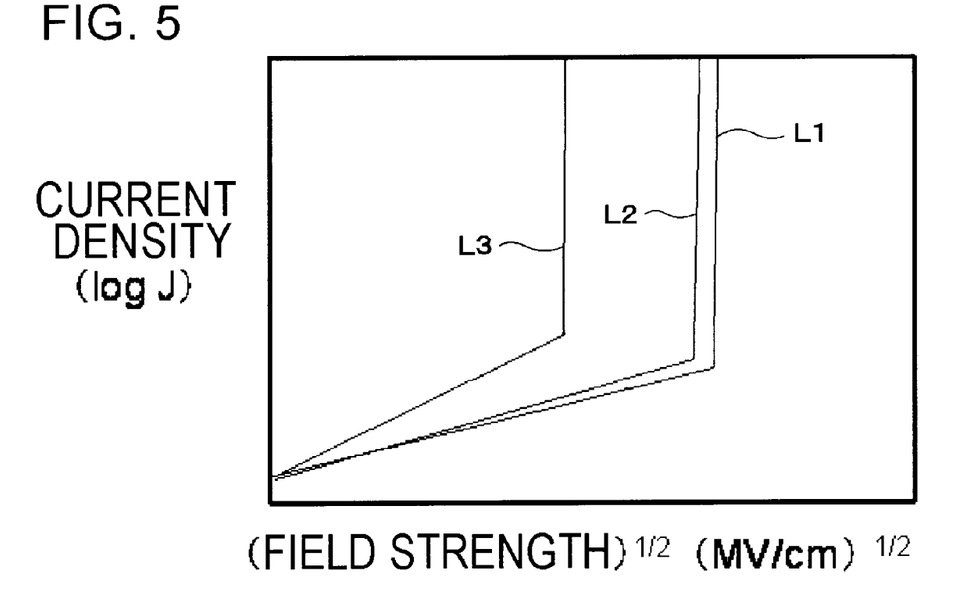
FIG. 5 shows a graph for explaining the advantageous effects of the first embodiment.

FIG. 1 shows a cross-sectional view illustrating the structure of a main part of a semiconductor device according to a first embodiment. FIGS. 2A through 2E and 3A through 3C show series of process drawings for explaining a method for manufacturing the semiconductor device according to the first embodiment, and each of them illustrates a cross-sectional view of the main part of the semiconductor device. FIG. 4 shows a table with examples of preferred combinations of the material forming the interconnect layer insulating films and the material forming the interlayer insulating film (the inter-via-layer insulating film). FIG. 5 shows a graph for explaining the advantageous effects of the first embodiment.

The semiconductor device according to the first embodiment includes: a first interconnect layer insulating film (including a first low dielectric constant film 4 and a first cap insulating film 5, for example); first copper interconnects 8 that are embedded in the first interconnect layer insulating film; an interlayer insulating film (a second low dielectric constant film 10, for example) that is formed above the first copper interconnects 8 and the first interconnect layer insulating film; a second interconnect layer insulating film (including a third low dielectric constant film 11 and a second cap insulating film 12, for example) that is formed on the interlayer insulating film; and second copper interconnects 16 that are embedded in the second interconnect layer insulating film. The first interconnect layer insulating film includes a first low dielectric constant film (the first low dielectric constant film 4, for example) that is made of an insulating film material having a relative permittivity lower than 3.0, and the second interconnect layer insulating film includes a second low dielectric constant film (the third low dielectric constant film 11, for example) that is made of an insulating film material having a relative permittivity lower than 3.0. The interlayer insulating film has higher mechanical strength than the first and second interconnect layer insulating films.

According to a method for manufacturing the semiconductor device according to the first embodiment, the following steps are sequentially carried out: the step of forming the first interconnect layer insulating film (the first low dielectric constant film 4 and the first cap insulating film 5, for example), the step of forming the first copper interconnects 8 embedded in the first interconnect layer insulating film, the step of forming the interlayer insulating film (the second low dielectric constant film 10, for example) that is formed above the first copper interconnects 8 and the first interconnect layer insulating film, the step of forming the second interconnect layer insulating film (including the third low dielectric constant film 11 and the second cap insulating film 12, for example) that is formed on the interlayer insulating film, and the step of forming the second copper interconnects 16 that are embedded in the second interconnect layer insulating film. The first interconnect layer insulating film includes a first low dielectric constant film (the first low dielectric constant film 4, for example) that is made of an insulating film material having a relative permittivity lower than 3.0, and the second interconnect layer insulating film includes a second low dielectric constant film (the third low dielectric constant film 11, for example) that is made of an insulating film material having a relative permittivity lower than 3.0. In the step of forming the interlayer insulating film, the interlayer insulating film is designed to have higher mechanical strength than the first and second low dielectric constant films.

The present embodiment is described below in greater detail.

First, the structure of the semiconductor device according to the first embodiment is described.

As shown in FIG. 1, the semiconductor device according to the first embodiment includes a semiconductor substrate 1 made of silicon. Although not shown in the drawing, active elements such as transistors and passive elements such as capacitors and resistors are formed on the semiconductor substrate 1. A first interlayer insulating film 2 is formed on those elements. A groove etching stopper layer 3, a first low dielectric constant film 4, and a first cap insulating film 5 are stacked in this order on the first interlayer insulating film 2.

The groove etching stopper layer 3 is formed with a SiC layer, a SiCN layer, or a stack structure of those layers, for example. The film thickness of the groove etching stopper layer 3 is 20 to 70 nm, for example.

The first low dielectric constant film 4 is calcined by a calcination process involving ultraviolet irradiation, for example. The first low dielectric constant film 4 is formed with a $Si_wO_xC_yH_z$ layer having holes, for example. Here, w, x, y, and z represent positive values. The film thickness of the first low dielectric constant film 4 can be equal to or more than 30 nm and equal to or less than 160 nm, for example, if the first low dielectric constant film 4 is a local layer or an intermediate layer. The thickness can be equal to or more than 50 nm and equal to or less than 800 nm, for example, if the first low dielectric constant film 4 is a semi-global layer or a global layer.

The first cap insulating film 5 is formed with a carbon-doped silicon oxide film (SiOC), for example. The film thickness of the first cap insulating film 5 can be equal to or more than 10 nm and equal to or less than 50 nm, for example, if the first low dielectric constant film 4 is a local layer or an intermediate layer. The thickness can be equal to or more than 40 and equal to or less than 80 nm, for example, if the first low dielectric constant film 4 is a semi-global layer or a global layer.

First interconnect forming grooves 6 are designed to penetrate through the first cap insulating film 5 and the first low dielectric constant film 4, and have such a depth as to reach the first interlayer insulating film 2. In each of the first interconnect forming grooves 6, a first copper interconnect 8 is formed, with a first barrier metal 7 being a liner. In other words, the first copper interconnects 8 are embedded in a first interconnect layer insulating film that is formed with the first low dielectric constant film 4 and the first cap insulating film 5.

A via etching stopper layer 9 is formed immediately above the first copper interconnects 8. The via etching stopper layer 9 contains SiCN, for example.

A second low dielectric constant film 10 is formed on the via etching stopper layer 9. More specifically, the second low dielectric constant film 10 as an interlayer insulating film is formed above the first copper interconnects 8 and the first cap insulating film 5. The second low dielectric constant film 10 is subjected to calculation that does not involve ultraviolet irradiation and only involves heating, for example.

A third low dielectric constant film 11 is formed on the second low dielectric constant film 10. The third low dielectric constant film 11 is subjected to calcination involving ultraviolet irradiation, for example. The film thickness of the third low dielectric constant film 11 can be equal to or more than 30 nm and equal to less than 160 nm, for example, if the third low dielectric constant film 11 is a local layer or an intermediate layer. The thickness can be equal to or more than 50 nm and equal to or less than 800 nm, for example, if the third low dielectric constant film 11 is a semi-global layer or a global layer.

A second cap insulating film 12 for protecting the third low dielectric constant film 11 is formed on the third low dielectric constant film 11. The film thickness of the second cap insulating film 12 can be equal to or more than 10 nm and equal to or less than 50 nm, for example, if the third low dielectric constant film 11 is a local layer or an intermediate layer. The thickness can be equal to or more than 40 nm and equal to or less than 80 nm, for example, if the third low dielectric constant film 11 is a semi-global layer or a global layer.

As described above, the third low dielectric constant film 11 and the second cap insulating film 12 that constitute a second interconnect layer insulating film are formed on the second low dielectric constant film 10 serving as an interlayer insulating film.

Via holes 13 are selectively formed in the second low dielectric constant film 10. Second interconnect forming grooves 14 are formed in the third low dielectric constant film 11. A second copper interconnect 16 is formed inside each of the via holes 13 and the second interconnect forming grooves 14, with a second barrier metal 15 being a liner. In other words, the second copper interconnects 16 are embedded in the second interconnect layer insulating film.

The first low dielectric constant film 4 forming the first interconnect layer insulating film is made of an insulating film material having a relative permittivity lower than 3.0. Likewise, the third low dielectric constant film 11 (the second low dielectric constant film) forming the second interconnect layer insulating film is made of an insulating film material having a relative permittivity lower than 3.0.

The second low dielectric constant film 10 as an interlayer insulating film has higher mechanical strength than the first and second interconnect layer insulating films.

Next, examples of preferred materials of the first and third low dielectric constant films 4 and 11 forming the interconnect layer insulating films, and examples of preferred materials of the second low dielectric constant film 10 as an inter-via-layer insulating film are described.

The first low dielectric constant film 4 and the third low dielectric constant film 11 are preferably designed to contain at least one of the following materials: porous SiO, porous SiOC, porous SiOCH, ladder oxide, and HSQ (Hydrogen Silsesquioxane), for example. More specifically, the first low dielectric constant film 4 and the third low dielectric constant film 11 are formed with one of the following films: porous SiO film, porous SiOC film, porous SiOCH film, ladder oxide film, and HSQ (Hydrogen Silsesquioxane) film, for example. The material of the first low dielectric constant film 4 and the material of the third low dielectric constant film 11 may be the same as each other, or may differ from each other.

The second low dielectric constant film 10 is preferably designed to contain at least one of the following materials: porous SiOC, porous SiOCH, dense SiOC (SiOC having no holes), dense $SiO_2$ ($SiO_2$ having no holes), and porous SiO, for example. More specifically, the second low dielectric constant film 10 is formed with one of the following films: porous SiOC film, porous SiOCH film, dense SiOC (SiOC having no holes) film, dense $SiO_2$ ($SiO_2$ having no holes) film, and porous SiO film, for example.

Here, porous SiOC and dense SiOC can be expressed as porous $Si_xO_yC_z$ and dense $Si_xO_yC_z$, respectively, with x, y, and z being positive values. Likewise, porous SiOCH can be expressed as porous $Si_wO_xC_yH_z$, with w, x, y, and z being positive values.

Meanwhile, the combination of the materials of the first and third low dielectric constant films 4 and 11 and the second low dielectric constant film 10 is selected so that the mechanical strength of the second low dielectric constant film 10 becomes higher than the mechanical strength of each of the first and third low dielectric constant films 4 and 11. The elastic modulus of the second low dielectric constant film 10 is preferably 4 GPa or higher, for example.

The second low dielectric constant film 10 is preferably made of a material that has higher chemical resistance than the first low dielectric constant film 4 and the third low dielectric constant film 11. Further, the second low dielectric constant film 10 is preferably made of a material that has higher heat resistance than the first low dielectric constant film 4 and the third low dielectric constant film 11.

In a case where both the first and third low dielectric constant films 4 and 11 and the second low dielectric constant film 10 are porous low dielectric constant films, the combination of the materials of the first and third low dielectric constant films 4 and 11 and the second low dielectric constant film 10 is preferably selected so that the hole occupancy rate of the second low dielectric constant film 10 is lower than the hole occupancy of each of the first and third low dielectric constant films 4 and 11. With this arrangement, the second low dielectric constant film 10 can have higher mechanical strength than each of the first and third low dielectric constant films 4 and 11.

In a case where the first and third low dielectric constant films 4 and 11 and the second low dielectric constant film 10 are made of the same material, the composition ratio can be appropriately set so that the second low dielectric constant film 10 has higher mechanical strength than each of the first and third low dielectric constant films 4 and 11.

More specifically, in a case where each of the first and third low dielectric constant films 4 and 11 and the second low dielectric constant film 10 is designed to contain porous $Si_xO_yC_z$, the values of x, y, and z can be set so that the mechanical strength of the second low dielectric constant film 10 becomes higher than the mechanical strength of each of the first and third low dielectric constant films 4 and 11. Likewise, in a case where each of the first and third low dielectric constant films 4 and 11 and the second low dielectric constant film 10 is designed to contain porous $Si_wO_xC_yH_z$, the values of w, x, y, and z can be set so that the mechanical strength of the second low dielectric constant film 10 becomes higher than the mechanical strength of each of the first and third low dielectric constant films 4 and 11.

Also, the mechanical strength of the second low dielectric constant film 10 can be made higher than the mechanical strength of each of the first and third low dielectric constant films 4 and 11 by varying the film forming method or the type of chemical solution used in the chemical treatment to be performed after the film formation.

In a case where the first and third low dielectric constant films 4 and 11 and the second low dielectric constant film 10 are made of the same material (or are designed to contain porous SiO or porous SiOC, for example), those films may be formed by CVD (Chemical Vapor Deposition). In that case, CVD is performed so that the molecular weight of the substance serving as a template in each of the first and third low dielectric constant films 4 and 11 becomes greater than the molecular weight of the substance in the second low dielectric constant film 10. With this arrangement, the hole diameter in each of the first and third low dielectric constant films 4 and 11 becomes larger than the hole diameter in the second low dielectric constant film 10, and the mechanical strength of the second low dielectric constant film 10 becomes higher than the mechanical strength of each of the first and third low dielectric constant films 4 and 11.

In a case where the first and third low dielectric constant films 4 and 11 and the second low dielectric constant film 10 are made of the same material (or are designed to contain porous SiO or porous SiOC, for example), those films may be formed by a spin coating technique. In that case, the molecular weight of micelles contained in the chemical solution used in the chemical treatment as a silylation process for bonding methyl groups to the film after the film formation is made larger in each of the first and third low dielectric constant films 4 and 11 than in the second low dielectric constant film 10. With this arrangement, the hole diameter in each of the first and third low dielectric constant films 4 and 11 becomes larger than the hole diameter in the second low dielectric constant film 10, and the mechanical strength of the second low dielectric constant film 10 becomes higher than the mechanical strength of each of the first and third low dielectric constant films 4 and 11.

Also, in a case where the first and third low dielectric constant films 4 and 11 and the second low dielectric constant film 10 are made of the same material, the hole occupancy rate of the second low dielectric constant film 10 can be made lower than the hole occupancy rate of each of the first and third low dielectric constant films 4 and 11. More specifically, calcination involving ultraviolet irradiation is performed on the first and third low dielectric constant films 4 and 11, calcination involving only heating is performed on the second low dielectric constant film 10. In this manner, the hole occupancy of the second low dielectric constant film 10 can be made lower than the hole occupancy rate of each of the first and third low dielectric constant films 4 and 11.

Referring now to FIG. 4, specific examples of combinations of materials of the first and third low dielectric constant films 4 and 11 and the second low dielectric constant film 10 are described.

For example, in a case where the first and third low dielectric constant films 4 and 11 as interconnect layer insulating films are designed to contain porous SiO, the second low dielectric constant film 10 as an interlayer insulating film (an inter-via-layer insulating film) is preferably designed to contain one of the following materials: porous SiOC, dense SiOC, and dense $SiO_2$. By setting such a combination, the mechanical strength of the second low dielectric constant film 10 can be made higher than the mechanical strength of each of the first and third low dielectric constant films 4 and 11.

In a case where each of the first and third low dielectric constant films 4 and 11 is designed to contain porous SiO, methyl groups are bonded to a porous SiO film by performing silylation. Through the silylation, methyl groups are bonded to at least one of the inner periphery of each hole and the surface of the porous SiO film.

Alternatively, the first and third low dielectric constant films 4 and 11 are designed to contain porous SiO, and the second low dielectric constant film 10 may also be designed to contain porous SiO. In that case, however, the chemical solution or the film forming method to be used for forming a porous SiO film is varied between the second low dielectric constant film 10 and the first and third low dielectric constant films 4 and 11, as described above. With this arrangement, the second low dielectric constant film 10 achieves higher mechanical strength. Specific differences in structure include the fact that the hole diameter of each of the first and third low dielectric constant films 4 and 11 is relatively large, and the hole diameter of the second low dielectric constant film 10 is relatively small.

In a case where the first and third low dielectric constant films 4 and 11 are designed to contain porous SiOC, the second low dielectric constant film 10 is preferably designed to contain dense SiOC or dense $SiO_2$, for example. By setting this combination, the mechanical strength of the second low dielectric constant film 10 can be made higher than the mechanical strength of each of the first and third low dielectric constant films 4 and 11.

Alternatively, the first and third low dielectric constant films 4 and 11 are designed to contain porous SiOC, and the second low dielectric constant film 10 may also be designed to contain porous SiOC. In that case, however, the chemical solution or the film forming method to be used for forming a porous SiOC film is varied between the second low dielectric constant film 10 and the first and third low dielectric constant films 4 and 11, as described above. With this arrangement, the second low dielectric constant film 10 achieves higher mechanical strength. Specific differences in structure include the fact that the hole diameter of each of the first and third low dielectric constant films 4 and 11 is relatively large, and the hole diameter of the second low dielectric constant film 10 is relatively small.

In a case where the first and third low dielectric constant films 4 and 11 are designed to contain ladder oxide or HSQ, the second low dielectric constant film 10 is preferably designed to contain dense $SiO_2$. By setting this combination, the mechanical strength of the second low dielectric constant film 10 can be made higher than the mechanical strength of each of the first and third low dielectric constant films 4 and 11.

A porous SiOCH (porous $Si_wO_xC_yH_z$) film or a porous SiOC (porous $Si_xO_yC_z$) film can be formed by plasma CVD using a raw gas that contains a siloxane-containing oligomer or methylsilane, for example. Examples of the siloxane-containing oligomer include TMCTS (1, 3, 5, 7-Tetra-Methyl-Cyclo-Tetra-Siloxane), and examples of methylsilane include 3MS (Tri-Methyl-Silane) and 4MS (Tetra-Methyl-Silane).

A porous $SiO_2$ film can be formed by performing calcination at equal to or more than 350° C. and equal to or less than 450° C. after a film is formed by a spin coating technique using a chemical solution containing a silica oligomer. Further, silylation using TMCTS (1, 3, 5, 7-Tetra-Methyl-Cyclo-Tetra-Siloxane) or HMDS (Hexa-Methyl-Disilazane) may be performed on the calcined porous $SiO_2$ film.

If a film containing a large amount of water is used as the inter-via-layer insulating film (the second low dielectric constant film 10), the water diffuses into the interconnect layer insulating films, and the interconnect layer insulating films as porous films deteriorate. As a result, the leakage current between the interconnects might become larger. As the distance between the interconnects becomes narrower (narrow pitch), the increase of the leakage current becomes more significant.

Therefore, it is preferable to select a film containing the smallest possible amount of water as the inter-via-layer insulating film. More specifically, a $SiO_2$ film or a porous SiO film having a hole diameter smaller than 2 nm is preferably used as the inter-via-layer insulating film (the second low dielectric constant film 10). A porous SiOC film may also be used as the inter-via-layer insulating film. In that case, a raw material for the film formation is preferable to be a material such as DEMS (diethoxymethylsilane) or DMOMS (dimethoxymethylsilane) that reduces the amount of water in the film, rather than a material such as DMDOSH (dimethyldioxysilylcyclohexane) or DMDMOS (dimethyldimethoxysilane) that increases the amount of water in the film. Alternatively, the inter-via-layer insulating film may be formed with a dense SiOC (SiOC without holes) film or a dense SiOCH (SiOCH without holes) film. By using those films having smaller amounts of water in films, as described above, as the inter-via-layer insulating film, the leakage current between the interconnects can be reduced, and the film strength can be increased.

Referring now to FIGS. 2A through 2E and 3A through 3C, a method for manufacturing the semiconductor device according to the present embodiment is described below.

Figure 2A:
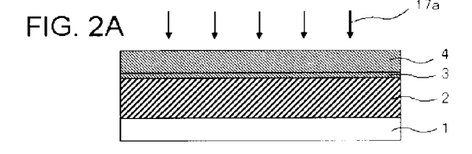
FIGS. 2A through 2E show a series of process drawings for explaining a method for manufacturing the semiconductor device according to the first embodiment.

First, as shown in FIG. 2A, active elements such as transistors (not shown) and passive elements such as capacitors and resistors (not shown) are formed on the semiconductor substrate 1 made of silicon.

The first interlayer insulating film 2 is then formed to insulate those elements from the later-described first copper interconnects 8 (FIG. 2C), except at contact conduction portions (not shown). The first interlayer insulating film 2 is made of a material containing PSG (Phospho-Silicate-Glass) by plasma CVD, and has a film thickness of 200 to 800 nm, for example.

The groove etching stopper layer 3 is then formed on the first interlayer insulating film 2. The groove etching stopper layer 3 is designed to restrict the variation in depth among the first interconnect forming grooves 6 (FIG. 2C) to be formed later to a certain range or narrower. The groove etching stopper layer 3 is a SiC film, a SiCN film, or a stack structure of those films, for example. The groove etching stopper layer 3 is formed to have a film thickness of approximately 30 nm by CVD (Chemical Vapor Deposition).

The first low dielectric constant film (a porous low-k film) 4 is then formed as an interconnect layer insulating film on the groove etching stopper layer 3. The first low dielectric constant film 4 may be a $Si_wO_xC_yH_z$ film, for example. Here, w, x, y, and z represent positive values. The first low dielectric constant film 4 is formed by CVD, for example. However, the first low dielectric constant film 4 may be formed by a coating technique, instead of CVD. The film thickness of the first low dielectric constant film 4 can be equal to or more than 30 nm and equal to or less than 160 nm, for example, if the first low dielectric constant film 4 is a local layer or an intermediate layer. The thickness can be equal to or more than 50 nm and equal to or less than 800 nm, for example, if the first low dielectric constant film 4 is a semi-global layer or a global layer.

Ultraviolet irradiation is then performed to reinforce a framework portion of the first low dielectric constant film 4 formed with Si—O—Si, and accelerate the removal of porogen formed with C—$H_n$ (n being 1, 2, or 3) from the first low dielectric constant film 4 (or accelerate the formation of holes in the first low dielectric constant film 4). In this manner, the first low dielectric constant film 4 can effectively approach an ideal structure from the surface to the bottom face. In the ideal structure, as the framework of Si—O—Si is formed, the film strength is increased, and holes are formed with a desired size distribution. In this ultraviolet irradiation process, ultraviolet rays 17a (FIG. 2A) of 200 to 500 nm in wavelength are applied onto the first low dielectric constant film 4 under the condition that temperature of the semiconductor substrate 1 is 350 to 420° C. In other words, a calcination process involving ultraviolet irradiation is performed. Through this calcination process, the film strength is increased in the first low dielectric constant film 4 from the surface to the bottom face, and holes are formed in the first low dielectric constant film 4 from the surface to the bottom face. Thus, the first low dielectric constant film 4 is modified from the surface to the bottom face.

Figures 2B, 2C:
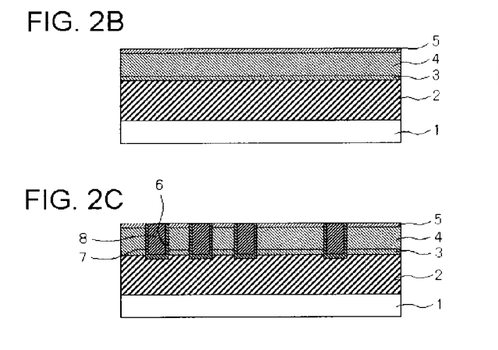

As shown in FIG. 2B, the first cap insulating film 5 is then formed on the first low dielectric constant film 4. The first cap insulating film 5 can be formed with a carbon-doped silicon oxide film (SiOC), for example. The first cap insulating film 5 is formed by the CVD, for example. The film thickness of the first cap insulating film 5 can be equal to or more than 10 nm and equal to or less than 50 nm, for example, if the first low dielectric constant film 4 is a local layer or an intermediate layer. The thickness can be equal to or more than 40 nm and equal to or less than 80 nm, for example, if the first low dielectric constant film 4 is a semi-global layer or a global layer, for example.

As shown in FIG. 2C, the first interconnect forming grooves 6 of a desired pattern are then formed. The first interconnect forming grooves 6 are designed to penetrate through the first cap insulating film 5, the first low dielectric constant film 4, and the groove etching stopper layer 3, and have such a depth as to reach the first interlayer insulating film 2, for example. The first interconnect forming grooves 6 may be formed by performing a photolithography process, a reactive dry etching process, and an asking process in this order, for example. The inside of each of the first interconnect forming grooves 6 is filled with the first barrier metal 7 and the first copper interconnect 8. Here, the first barrier metal 7 is made of a Ta-containing high melting point metal, for example. Excess portions of the first copper interconnects 8 and the first barrier metal 7 are then removed by CMP (Chemical Mechanical Polish). More specifically, the excess portions of the material of the first copper interconnects 8 sticking out of the formation regions (the first interconnect forming grooves 6) of the first copper interconnects 8 are removed by CMP.

Figure 2D:
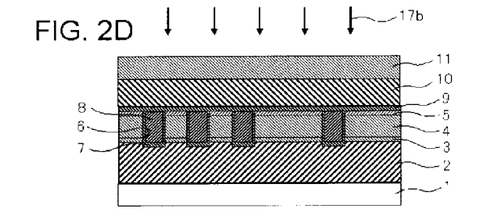

As shown in FIG. 2D, the via etching stopper layer 9 is then formed. The via etching stopper layer 9 serves to restrict the depth variation among the via holes 13 (FIG. 2E) to be formed later to a certain range or narrower. The via etching stopper layer 9 is designed to contain SiCN and have a film thickness of approximately 30 nm, for example.

The second low dielectric constant film 10 as the inter-via-layer insulating film is then formed on the via etching stopper layer 9. A heat treatment is then performed at 300 to 420° C., to calcine the second low dielectric constant film 10. This heat treatment is preferably performed in an inert gas atmosphere (a diluted gas atmosphere) or in a nitrogen atmosphere. To calcine the second low dielectric constant film 10, only heating is performed, and ultraviolet irradiation is not performed.

The third low dielectric constant film (the porous Low-k film) 11 as an interconnect layer insulating film is then formed on the second low dielectric constant film 10. The third low dielectric constant film 11 may be formed with a $Si_wO_xC_yH_z$ film, for example. Here, w, x, y, and z are positive values. The third low dielectric constant film 11 may be formed by CVD, for example. The third low dielectric constant film 11 may be formed by a coating technique, instead of CVD. The film thickness of the third low dielectric constant film 11 can be equal to or more than 30 nm and equal to or less than 160 nm, for example, if the third low dielectric constant film 11 is a local layer or an intermediate layer. The thickness can be equal to or more than 50 nm and equal to or less than 800 nm, for example, if the third low dielectric constant film 11 is a semi-global layer or a global layer.

Ultraviolet irradiation is then performed to reinforce the framework portion of the third low dielectric constant film 11 formed with Si—O—Si, and accelerate the removal of porogen formed with C-H$_o$ (n being 1, 2, or 3) from the third low dielectric constant film 11 (or accelerate the formation of holes in the third low dielectric constant film 11). In this ultraviolet irradiation process, ultraviolet rays 17b (FIG. 2D) of 200 to 500 nm in wavelength are applied onto the third low dielectric constant film 11 under the condition that temperature of the semiconductor substrate 1 is 350 to 420° C. In other words, a calcination process involving ultraviolet irradiation is performed. Through this calcination process, the film strength is increased in the third low dielectric constant film 11 from the surface to the bottom face, and holes are formed in the third low dielectric constant film 11 from the surface to the bottom face. Thus, the third low dielectric constant film 11 is modified from the surface to the bottom face.

The second cap insulating film 12 is then formed on the third low dielectric constant film 11. The second cap insulating film 12 can be made of the same material as the first cap insulating film 5 and can be formed by CVD like the first cap insulating film 5. The film thickness of the second cap insulating film 12 can be equal to or more than 10 nm and equal to or less than 50 nm, for example, if the third low dielectric constant film 11 is a local layer or an intermediate layer. The thickness can be equal to or more than 40 nm and equal to or less than 80 nm, for example, if the third low dielectric constant film 11 is a semi-global layer or a global layer.

Figure 2E:
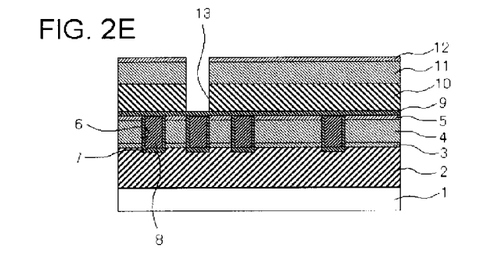

As shown in FIG. 2E, the via holes 13 are formed by a photolithography process and a reactive ion etching process. Here, the bottoms of the via holes 13 are designed to reach the via etching stopper layer 9 but not to reach the first copper interconnects 8. The raw gas for the reactive ion etching may be a mixed gas containing CF$_4$, for example. The mixed gas is turned into plasma by high-frequency power of 13.56 MHz under the condition that the pressure is 0.1 to 10 Torr, and etching is then performed.

Figure 3A:
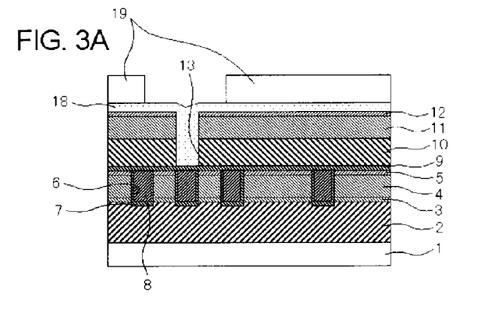
FIGS. 3A through 3C show a series of process drawings for explaining the method for manufacturing the semiconductor device according to the first embodiment.

As shown in FIG. 3A, an organic film 18 is buried in the via holes 13, so as to be in contact with the surface of the via etching stopper layer 9. The organic film 18 may be formed by performing a spin coating process and a heat treatment in this order, for example.

A second interconnect groove forming photoresist 19 is then formed on the organic film 18, and is processed into a desired pattern. The second interconnect groove forming photoresist 19 may be a single-layer structure or a stack structure. However, a detailed description on how many layers should be selectively removed by exposure and development in the case of a stack structure is not provided herein.

Figure 3B:
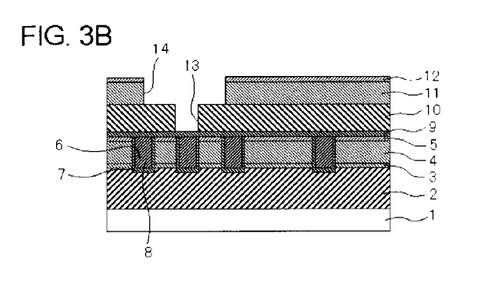

As shown in FIG. 3B, with the second interconnect groove forming photoresist 19 serving as a mask, the second interconnect forming grooves 14 are opened by reactive ion etching. The organic film 18 partially remains at the bottom portions of the via holes 13, and Cu (the surfaces of the first copper interconnects 8) is not exposed through the bottoms of the via holes 13 at the time of the reactive ion etching. The organic film 18 is then removed.

Figure 3C:
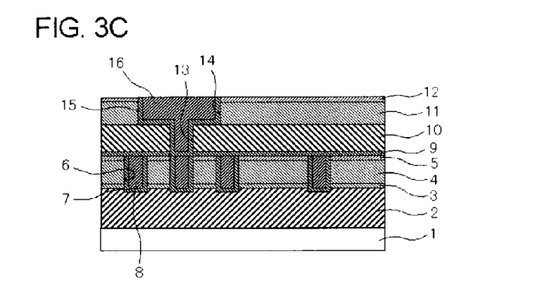

As shown in FIG. 3C, the second barrier metal 15 is then formed in each of the via holes 13 and the second interconnect forming grooves 14 by a sputtering technique, and a metallic material containing Cu is buried in the via holes 13 and the second interconnect forming grooves 14 by Cu plating. The excess Cu and excess barrier metal are removed by a CMP process. More specifically, the excess portions of the material forming the second copper interconnects 16 sticking out of the formation regions (the second interconnect forming grooves 14) of the second copper interconnects 16 are removed by CMP. In this manner, the second copper interconnects 16 are formed.

In the present embodiment, examples with two interconnect layers, one is an interconnect layer including the first copper interconnects 8, and the other is an interconnect layer including the second copper interconnects 16, were described. However, the number of interconnect layers may be three or more. In a case where three or more copper interconnect layers are formed, a series of procedures of FIGS. 2D, 2E, 3A, 3B, and 3C are added for every additional interconnect layer. After the uppermost interconnect layer is formed, bonding pads (not shown) for an assembling process are formed on the uppermost copper interconnects. However, a detailed description of this procedure is not provided herein.

In the above described manufacture method, ultraviolet irradiation is performed when the first and third low dielectric constant films 4 and 11 are calcined. However, in a case where the first and third low dielectric constant films 4 and 11 are designed to contain ladder oxide or HSQ, it is preferable not to perform ultraviolet irradiation during the calcination process.

According to the above described first embodiment, the second low dielectric constant film 10 as the interlayer insulating film has higher mechanical strength than each of the first and third low dielectric constant films 4 and 11 forming the interconnect layer insulating films. Accordingly, the film strength of the interlayer insulating film can be sufficiently secured. In this manner, the first embodiment can provide a semiconductor device in which formation of cracks in the interlayer insulating film and delamination of the interlayer insulating film are appropriately reduced.

In a semiconductor device having a structure in which each interconnect layer insulating film includes a low dielectric constant film and a cap insulating film formed on the low dielectric constant film, the cap insulating film is damaged by ultraviolet irradiation, and the following problems might be caused. Each cap insulating film has a function as a protection layer in a chemical mechanical polishing (CMP) process for Cu, and is formed with a SiOC film, for example. If ultraviolet rays are applied onto a cap insulating film when a semiconductor device including the cap insulating film is manufactured, defects might be formed in the cap insulating film or in the interfaces above and below the cap insulating film. The defects serve as the paths for leakage current. Therefore, once the defects are formed, the leakage current between interconnects easily increases, the breakdown field strength of the interconnect layer insulating films easily reduces (a decrease in dielectric strength voltage), and the operating life easily becomes shorter in TDDB (Time Dependent Dielectric Breakdown) tests. This is because a leakage current flows when a potential difference is given between adjacent interconnects, as the bond in the cap insulating film is broken by ultraviolet irradiation, or as the bond among the cap insulating film, the interconnect layer insulating films above and below the cap insulating film, and the interlayer insulating film is broken. In recent years, ultraviolet irradiation is often performed when low dielectric constant films are calcined. If ultraviolet irradiation is performed not only during formation of an interconnect layer insulating film but also during formation of an interlayer insulating film (a inter-via-layer insulating film) located above the interconnect layer insulating film, the ultraviolet rays reach the cap insulating film located on the upper face of the interconnect layer insulating film, and adversely affect the cap insulating film. As a result, a leakage current flows, or a breakdown might be caused at a relatively low voltage.

If calcination involving heating is performed on the interlayer insulating film, instead of calcination involving ultraviolet irradiation, material for the interlayer insulating film must be properly selected so that sufficient film strength cannot be secured for the interlayer insulating film. Otherwise, during a CMP processor the like, cracks might be formed in the interlayer insulating film, or the interlayer insulating film might be delaminated.

Using the method for manufacturing the semiconductor device according to the present embodiment, on the other hand, the process of forming the second low dielectric constant film 10 includes the process of performing calcination involving only heating on the second low dielectric constant film 10, and the process of forming the third low dielectric constant film 11 includes the process of modifying the third low dielectric constant film from the surface to the bottom face by performing calculating involving ultraviolet irradiation on the third low dielectric constant film 11. Accordingly, the third low dielectric constant film 11 can be modified from the surface to the bottom face by ultraviolet irradiation, and the damage to the first cap insulating film 5 due to ultraviolet rays can be made smaller than in a case where the calculation of the second low dielectric constant film 10 also involves ultraviolet irradiation. As a result, formation of defects in the first cap insulating film 5 and the interfaces located above and below the first cap insulating film 5 can be reduced. Thus, it becomes possible to restrict the leakage current between the first copper interconnects 8 due to such defects, restrict the decrease in breakdown field strength of the first low dielectric constant film 4, and restrict degradation of life in TDDB tests.

Furthermore, since the second low dielectric constant film 10 is formed with at least one of a porous SiOC film, a porous SiOCH film, a dense SiOC film, a dense $SiO_2$ film, and a porous SiO film, the second low dielectric constant film 10 having sufficient film strength can be formed simply by performing calculation involving only heating on the second low dielectric constant film 10. Accordingly, it is possible to lower the possibility of causing cracks in the second low dielectric film 10 and the possibility of allowing the second low dielectric constant film 10 to be delaminated in a CMP process or the like.

As described above, according to the present embodiment, the low dielectric constant film (the second low dielectric constant film (the third low dielectric constant film 11)) of an interconnect layer insulating film (the second interconnect layer insulating film) is modified from the surface to the bottom face by ultraviolet irradiation. Also, damage to the cap insulating film (the first cap insulating film 5) of the lower interconnect layer insulating film (the first interconnect layer insulating film) due to ultraviolet irradiation is reduced, and the film strength of the interlayer insulating film (the second low dielectric constant film 10) above the cap insulating film (the first cap insulating film 5) can be sufficiently secured.

The mechanism for reducing the damage to the first cap insulating film 5 due to ultraviolet rays is now described in greater detail. The next time the first low dielectric constant film 4 calcined by ultraviolet irradiation is subjected to ultraviolet rays is after the second low dielectric constant film 10 calcined only by heating and the third low dielectric constant film 11 are formed. With this arrangement, the ultraviolet rays are applied this time through both of the second low dielectric constant film 10 and the third low dielectric constant film 11. Accordingly, impact of the ultraviolet irradiation on the bonding state between the first low dielectric constant film 4 and the first cap insulating film 5 formed on the first low dielectric constant film 4 can be restricted to a small degree. Accordingly, an increase in leakage current between adjacent interconnects, by breaking the bond in the SiOC serving as the first cap insulating film 5 by ultraviolet irradiation, can be reduced and degradation of life in TDDB tests, by breaking the bond between the SiOC and the layer insulating films above and below the SiOC, by ultraviolet irradiation, can also be reduced.

FIG. 5 shows relationships between the voltage applied to the interconnects (the abscissa axis) and the leakage current between adjacent interconnects (the ordinate axis). In the drawing, L1 represents the data about a semiconductor device manufactured by the method for manufacturing a semiconductor device according to the present embodiment. L2 represents the data about a semiconductor device with a single interconnect layer. L3 represents the data about a semiconductor device manufactured by a method for manufacturing that differs from the method for manufacturing a semiconductor device according to the present embodiment only in that calcination involving ultraviolet irradiation is also performed on the second low dielectric constant film 10.

As can be seen from the comparison between L3 and L2, in the case where ultraviolet irradiation is performed in the calcination of both of the first low dielectric constant film 4 as an interconnect layer insulating film and the second low dielectric constant film 10 as the inter-via-layer insulating film (L3), the leakage current between the first copper interconnects 8 increases, and the dielectric strength voltage becomes lower.

As can be seen from the comparison between L1 and L2, on the other hand, in the case of the present embodiment where ultraviolet irradiation is not performed in the calcination of the second low dielectric constant film 10 as the inter-via-layer insulating film, the leakage current between interconnects and the dielectric strength voltage can be maintained at the same levels as those in the case with the single interconnect layer (L2). In other words, in the case of L1, the leakage current can be made smaller, and the dielectric strength voltage can be made higher than in the case of L3.

Also, in a case where ultraviolet irradiation is performed in the calcination of the first low dielectric constant film 4 as in the present embodiment, the number of times the first low dielectric constant film 4 is subjected to ultraviolet irradiation becomes larger than in the present embodiment if ultraviolet irradiation is also performed in the calcination of the second low dielectric constant film 10. As a result, the first low dielectric constant film 4 might also be damaged by ultraviolet irradiation. In the present embodiment, on the other hand, ultraviolet irradiation is not performed in the calcination of the second low dielectric constant film 10 and, therefore, the damage to the second low dielectric constant film 4 due to ultraviolet irradiation can be reduced.

[Second Embodiment]

Figure 6:
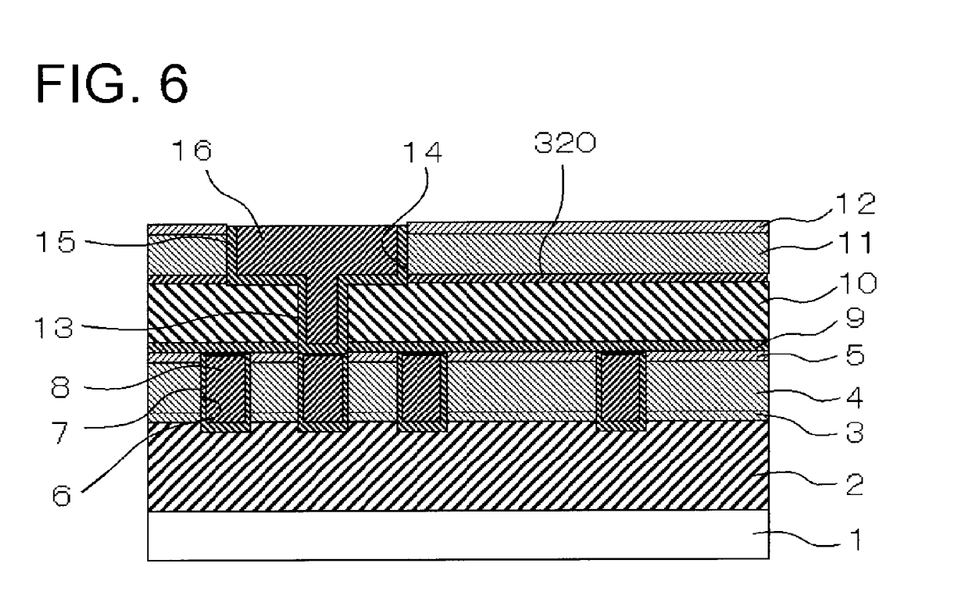
FIG. 6 shows a cross-sectional view illustrating the structure of a semiconductor device manufactured by a method for manufacturing semiconductor device according to a second embodiment.

FIG. 6 shows a cross-sectional view illustrating the structure of a semiconductor device according to a second embodiment.

The semiconductor device illustrated in FIG. 6 differs from the semiconductor device illustrated in FIG. 1 only in that a groove etching stopper layer 320 is interposed between the second low dielectric constant film 10 and the third low dielectric constant film 11. The other aspects of the semiconductor device in FIG. 6 are the same as those of the semiconductor device illustrated in FIG. 1.

The groove etching stopper layer 320 is formed with an insulating film containing SiC or SiCN, for example. The film thickness of the groove etching layer 320 is set at 10 to 30 nm, for example. The groove etching stopper layer 320 serves to restrict the depth variation among the second interconnect forming grooves 14 (FIG. 6) to be formed later to a certain range or narrower.

The method for manufacturing the semiconductor device according to the present embodiment differs from the method according to the first embodiment only in that, after formation of the second low dielectric constant film 10 (to be more specific, after the calcination of the second low dielectric constant film 10, for example), the groove etching stopper layer 320 is formed on the second low dielectric constant film 10.

According to the second embodiment, the groove etching stopper layer 320 is interposed between the second low dielectric constant film 10 and the third low dielectric constant film 11. Accordingly, the adverse impact of the ultraviolet rays in the calcination of the third low dielectric constant film 11 on the bonding state between the first low dielectric constant film 4 and the first cap insulating film 5 can be further reduced. As a result, the increase in leakage current and degradation of life in TDDB tests can be further restrained.

It is apparent that the present invention is not limited to the above embodiment, and may be modified and changed without departing from the scope and spirit of the invention.

What is claimed is:

1. A semiconductor device comprising:
   a first interconnect layer insulating film;
   a plurality of first copper interconnects that are embedded in said first interconnect layer insulating film;
   an interlayer insulating film that is formed on said first copper interconnects and said first interconnect layer insulating film;
   a second interconnect layer insulating film that is formed on said interlayer insulating film; and
   a plurality of second copper interconnects that are embedded in said second interconnect layer insulating film,
   wherein said first interconnect layer insulating film including a first low dielectric constant film that is made of an insulating film material having a relative permittivity lower than 3.0,
   wherein said second interconnect layer insulating film including a second low dielectric constant film that is made of an insulating film material having a relative permittivity lower than 3.0, and
   wherein said interlayer insulating film having higher mechanical strength than said first and second interconnect layer insulating films,
   wherein said interlayer insulating film is of a different material than said second interconnect layer insulating film.

2. The semiconductor device according to claim 1, wherein said interlayer insulating film contains at least one of the materials: porous SiOC, porous SiOCH, dense SiOC, dense $SiO_2$, and porous SiO.

3. The semiconductor device as claimed in claim 1, wherein said first and second low dielectric constant films contain at least one of the materials: porous SiO, porous SiOC, porous SiOCH, ladder oxide, and HSQ (Hydrogen Silsesquioxane).

4. The semiconductor device according to claim 1, wherein
   each of said interlayer insulating film, said first low dielectric constant film, and said second low dielectric constant film is a porous film, and
   said interlayer insulating film has a lower hole occupancy rate than said first and second low dielectric constant films.

5. A method for manufacturing a semiconductor device, comprising:
   forming a first interconnect layer insulating film;
   forming a plurality of first copper interconnects that are embedded in said first interconnect layer insulating film;
   forming an interlayer insulating film on said first copper interconnects and said first interconnect layer insulating film;
   forming a second interconnect layer insulating film on said interlayer insulating film; and
   forming a plurality of second copper interconnects that are embedded in said second interconnect layer insulating film,
   wherein said forming said first interconnect layer insulating film, said forming said first copper interconnects, said forming said interlayer insulating film, said forming said second interconnect layer insulating film, and said forming said second copper interconnects being performed in this order,
   wherein said first interconnect layer insulating film including a first low dielectric constant film that is made of an insulating film material having a relative permittivity lower than 3.0,
   wherein said second interconnect layer insulating film including a second low dielectric constant film that is made of an insulating firm material having a relative permittivity lower than 3.0, and
   wherein said forming said interlayer insulating film including forming said interlayer insulating film having higher mechanical strength than said first and second low dielectric constant films,
   said forming the interlayer insulating film includes performing, calcination involving only heating on said interlayer insulating film, and
   said forming the second interconnect layer insulating film includes modifying said second low dielectric constant film from a surface to a back face by performing calcination involving ultraviolet irradiation on said second low dielectric constant film.

6. The method for manufacturing a semiconductor device according to claim 5, wherein said interlayer insulating, film is formed as a film containing at least one of the materials: porous SiOC, porous SiOCH, dense SiOC, dense $SiO_2$, and porous SiO.

7. The method for manufacturing a semiconductor device according to claim 5, wherein said first and second low dielectric constant films are formed as films containing at least one of the materials: porous SiO, porous SiOC, porous SiOCH, ladder oxide, and HSQ (Hydrogen Silsesquioxane).

8. The method for manufacturing a semiconductor device according to claim 5, wherein
   said first interconnect layer insulating film further includes a first cap insulating film formed on said first low dielectric constant film,
   said second interconnect layer insulating film further includes a second cap insulating film formed on said second low dielectric constant film,
   after said forming the second copper interconnects, excess portions of a material forming said second copper interconnects are removed by CMP, said excess portions sticking out of formation regions of said second copper interconnects.

9. The method for manufacturing a semiconductor device according to claim 8, wherein ultraviolet rays applied in said calcination involving said ultraviolet irradiation are equal to or more than 200 nm and equal to or less than 500 nm in wavelength.

10. The method for manufacturing a semiconductor device according to claim 5, wherein
   each of said interlayer insulating film, said first low dielectric constant film, and said second low dielectric constant film is a porous film, and
   said interlayer insulating film has a lower hole occupancy rate than said first and second low dielectric constant films.

11. The method for manufacturing a semiconductor device according to claim 5, wherein said forming the interlayer insulating film includes forming a porous SiOC film, using DEMS (diethoxymethylsilane) or DMOMS (dimethoxymethylsilane) as a film forming material.

12. The method for manufacturing a semiconductor device according to claim 5, wherein said interlayer insulating film is of a different material than said second interconnect layer insulating film.

* * * * *